Figure 1:
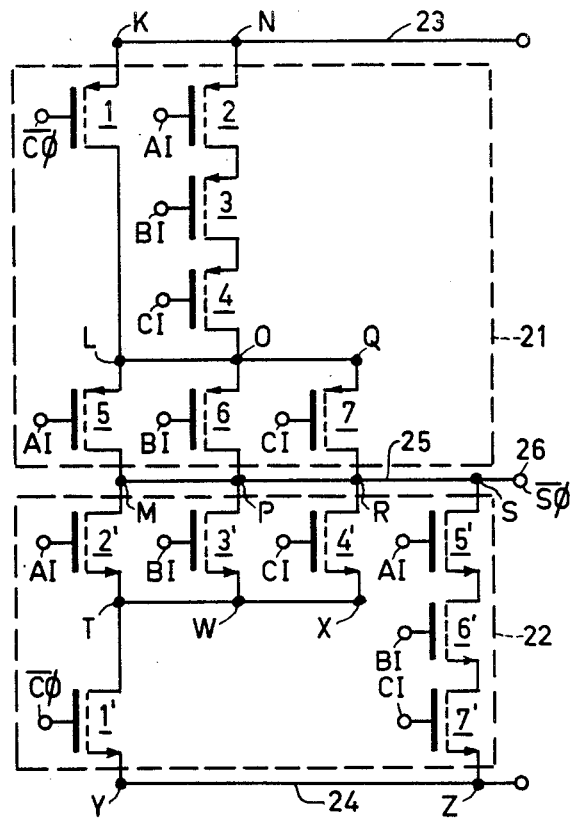
Figure 1:
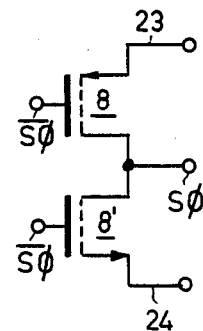

United States Patent [19]
Wagner

[11] Patent Number: 4,965,651
[45] Date of Patent: Oct. 23, 1990

[54] CMOS LOGIC ARRAY LAYOUT

[75] Inventor: Karl Wagner, Nijmegen, Netherlands

[73] Assignee: U.S. Philips Corporation, New York, N.Y.

[21] Appl. No.: 330,942

[22] Filed: Mar. 23, 1989

Related U.S. Application Data

[63] Continuation of Ser. No. 193,133, May 5, 1988, abandoned, which is a continuation of Ser. No. 260,559, May 5, 1981, abandoned, which is a continuation of Ser. No. 947,922, Oct. 2, 1978, abandoned, which is a continuation of Ser. No. 737,598, Nov. 1, 1976, abandoned, which is a continuation of Ser. No. 617,987, Sep. 29, 1975, abandoned, which is a continuation of Ser. No. 436,186, Jan. 24, 1974, abandoned.

[30] Foreign Application Priority Data

Feb. 1, 1973 [NL] Netherlands ............... 7301433

[51] Int. Cl.$^5$ ............... H01L 27/102; H01L 27/105
[52] U.S. Cl. ............................ 357/42; 357/44; 357/45
[58] Field of Search ..................... 357/42, 45, 44

[56] References Cited

U.S. PATENT DOCUMENTS 3,356,858 12/1967 Wanlass ........................... 357/42
3,646,665 3/1972 Kim ................................ 357/42
3,783,047 1/1974 Paffen et al. .................... 357/50

OTHER PUBLICATIONS

RCA COSMOS Manual, RCA, Somerville, N.J., 1971, pp. 24–26.
Faggin et al, Solid State Electronics, Aug. 1970, pp. 1129–1131 and 1143.
RCA COS/MOS Datebook, #SSD 203, (RCA, Somerville, 1972), p. 83, CD4019.
Electronics, Aug. 30, 1971, pp. 38–43 (especially FIG. 6 and 7a).

Primary Examiner—William D. Larkins
Attorney, Agent, or Firm—Robert T. Mayer

[57] ABSTRACT

An integrated logic circuit with complementary transistors which is constructed from cells which form reproductions of logic equations, in which each cell has at least three transistors arranged one next to the other in a row and three complementary transistors arranged one next to the other. Series arrangements of transistors or transistor circuits in one row corrugated to parallel arrangements of transistors or transistor circuits in the other row. This arrangement results in compact layouts which are easy to design with computer assistance. The arrangement is particularly useful for MSI and LSI circuits.

18 Claims, 9 Drawing Sheets

CMOS LOGIC ARRAY LAYOUT

This is a continuation of Ser. No. 193,133 filed May 5, 1988, now abandoned, which was a continuation of Ser. No. 260,559 filed May 5, 1981, now abandoned, which was a continuation of Ser. No. 947,922 filed Oct. 2, 1978, now abandoned, which was a continuation of Ser. No. 737,598 filed Nov. 1, 1976, now abandoned, which was a continuation of Ser. No. 617,987 filed Sept. 29, 1975, now abandoned, which was a continuation of Ser. No. 436,186 filed Jan. 24, 1974, now abandoned.

The invention relates to an integrated circuit comprising a logic circuit composed of complementary transistors in which one or more surface regions of a first conductivity type are present in a semiconductor body and comprise semiconductor zones of transistors of one type and one or more surface regions of the second opposite conductivity type which comprise semiconductor zones of transistors of the type complementary to the one type.

As is known, the integrated circuit technology is developing in a direction towards ever more complicated products having an increasing number of circuit elements per semiconductor body. As a result of said increasing complexity, the design of this type of integrated circuits, notably those which are sometimes referred to by the name of MSI (of medium scale integration) or LSI (of large scale integration) circuits, becomes a laborious and time-consuming job in which in addition the possibility of mistakes in the design increases considerably. In this connection it is no wonder that rationalization of and the use of computers in designing is endeavoured so as to shorten in this way the time of designing, to reduce the possibility of design errors and in general also to realise a saving in the design costs.

By the name of "Micromosaic" a system is known of which the base is formed by a number of standard cells which each generate a certain logic function and the topology or lay-out of which is optimized as readily as possible. All these cells have the same standard dimension in one direction, for example the height, while the dimension in the width may differ from each other. The integrated circuit is constructed with a number of said standard cells which are placed in rows behind each other. Between the various rows and if necessary also between adjacent cells of the same row, space is left free to make electric connections between the cells mutually to make connections to connection pads or lands present near the edge of the semiconductor body. The distribution of the required cells over and the location thereof in the various rows, as well as the required pattern of connection conductors and the space required for that purpose between the rows and between the cells of a row, are determined by means of a computer. An imaginary grid is used in which the connection points of the cells are situated on grid points of the grid and electric connections can be indicated by field lines extending into mutually perpendicular directions from grid point to grid point. Such connections can be realized in the integrated circuit with conductor tracks present in two layers which are insulated from each other, the tracks of one layer crossing those of the other layer at right angles. Where necessary, connections between tracks of one layer and of the other layer can simply be effected via apertures in the intermediate insulating layer situated on grid points of the imaginary grid.

It will be obvious that it is especially the ordering which is obtained by causing the connections to extend according to grid lines of an imaginary grid and using rows of cells having a standard height and connection points present on grid points which makes the designing at least partly accessible for the use of computers. On the other hand, in addition to the limitation of the required calculating time of the computer which is also necessary, said ordering means a restriction of the possibilities which goes at the expense of the optimum use of the available semiconductor area. That in this manner economically justified designs can nevertheless be obtained is due to a considerable extent to the fact that the topology of the standard cells including their internal connections within the restrictions imposed by the prescribed height and the location of the connection points on grid points can be optimized beforehand and once.

For completeness' sake it is to be noted that the making accessible of the designing for handling by means of computers is notably of importance, for example, for the combinatory logic or combinations of combinatory and sequential logic and to a smaller extent for systems which are characterized by the use of large numbers of identical elements connected in row or matrix form, for example memories, which as a matter of course show already a great regularity.

An important drawback of the described system of designing is related to the use of standard cells as a base. The size of the library of standard cells is a compromise between the desired flexibility of the design system on the one hand and the desired complexity of the cells individually on the other hand. A reasonably optimum use of the semiconductor surface requires standard cells which are as large as possible because actually the topology of the cells only is optimized. However, large cells involve the generation of complex logic functions so that thereof a large number of different ones is necessary to ensure sufficient flexibility and application possibilities of the design systems. Therefore, a rather large library is necessary in practice which has inter alia the drawback that when the manufacturing technology is varied, a new topology must be made for a large number of cells.

It is the object of the invention to provide integrated circuits which can be designed by means of a design system in which the drawbacks of the described known system are avoided or at least mitigated. It is inter alia based on the recognition of the fact that for that purpose the use of previously optimized standard cells must be restricted as much as possible and that the designing of cells which generate logic functions must also be brought as much as possible within the operational range of the design system. It is furthermore based on the recognition of the fact that in order to prevent a far from optimum use of the semiconductor surface in designing logic cells, the circuit diagram should be constructed preferably with a fixed regularity, at least according to a minimum number of strictly performed rules, and with as few different circuit elements as possible, in which said regularity of the circuit diagram must also have for its result that a corresponding fixed regularity in the topology also yields a substantially optimum topology from a point of view of the effective use of the semiconductor surface area. It has been found that notably the use of complementary techniques, that is to say the substantially exclusive use of complementary transistors, may result in the desired combination of properties.

The invention provides a system of designing integrated logic circuits with complementary transistors and integrated circuits with a new and advantageous construction and topology, in which one or more surfaces regions of a first conductivity type which comprise semiconductor zones of transistors of one type and one or more surface regions of the second opposite conductivity type which comprise semiconductor zones of transistors of the complementary type are present in a semiconductor body and which are characterized by the combination of the following properties:

1. the logic circuit comprises two parts which are connected in series between two supply lines, the node between the said two parts forming the electric signal output, the transistors of one part being all of the same one (npn or pnp) type and the transistors of the other part being all of the same complementary (pnp or npn) type,
2. for each transistor in one part a corresponding complementary transistor is present in the other part, the control electrodes of corresponding transistors being connected together,
3. both parts of the circuit each individually form the same logic combination of logic input signals to be applied, in which, if one part forms a conductive connection between one supply line and the signal output, all the current paths in the other part between the other supply line and the signal output comprise at least one non-conductive transistor and are hence substantially interrupted,
4. the transistors of one part are arranged in the semiconductor body beside each other in a first row and the corresponding transistors of the other part are arranged in a second row which is substantially parallel to the first row,
5. the supply lines extend substantially parallel to the said rows of transistors, each signal line crossing at least one of the supply lines.

The sequence of arrangement of the transistors in the first row preferably corresponds to that of the second row.

That both parts of the circuit each individually form the same logic combination of logic input signals to be applied or in other words both parts satisfy the same truth table is advantageously ensured in that a correlation is present between the two parts of the circuit in which each series arrangement of two or more transistors in the one part is consistent with parallelism of the corresponding transistors in the other part and parallelism of transistors in the one part is consistent with a series arrangement of the corresponding transistors in the other part, in which a transistor shows parallelism with one or more other transistors of the same part only when said transistors together constitute a group all transistors of which form part of different current paths present between a supply line and the signal output in said part and in addition none of the transistors of said group is incorporated in the same series circuit with another transistor of the group.

The regularity of the circuit diagram added to the regularity of the topology obtained by the simple juxtaposition in rows of the transistors independently of whether they are arranged in series or in parallel in the circuit diagram, provides compact logic circuits or cells having a substantially square or rectangular boundary which can simply be arranged one behind the other in a direction parallel to the supply lines. Because the corresponding complementary transistors are preferably also juxtaposed in the same sequence, it may be said that the cells are constructed with topological components each comprising two corresponding transistors, said components, at least in relation to most of the cells, being so small that also in the case of the regular and simple juxtaposition of said components a substantially optimum topology of the cells is obtained. In this connection it is also important that substantially no other types of circuit elements, such as resistors, or at least comparatively few circuit elements of different types are necessary. The signal lines extend predominantly transversely to the supply lines across the cells and also as a result of this, the cells are easily accessible in said transverse direction on both oppositely located sides of the cell for the supply and removal of signals. Furthermore, apart from the signal lines, substantially no internal connections are necessary within the cells between the two parts, so between the two rows of transistors, so that further internal connections which extend substantially parallel to the supply lines will substantially suffice.

The integrated circuit is furthermore advantageously characterized in that several logic circuits or cells are present which are constructed in a corresponding manner, at least two of the said logic circuits forming mutually differing logic combinations of input signals, hence generate different logic functions. For the logic description of such cells which are constructed entirely in a similar manner, equations in Boolean algebra are thus necessary which differ from each other.

It will be obvious that in the present design system for making interconnections between cells use is also made of the above-mentioned imaginary grid. This means that the signal lines at the edge of the cell are situated on grid points of the imaginary grid. Preferably, however, the parts of the signal lines present within the cell coincide throughout their length with lines of the imaginary grid. The supply lines preferably also extend according to lines of the imaginary grid. Characteristic of said preferred embodiment of the integrated circuit according to the invention therefore is that the grid used for connections between different cells continues across the cells themselves to a considerable extent, in which at least the signal lines within the cells, at least in so far as they extend in a direction substantially transverse to the supply lines, are provided according to grid lines of the said grid. The remaining internal connections of the cells may fit on said grid entirely or at least to a considerable extent.

The integrated circuit according to the invention is preferably constructed with field effect transistors. Because such transistors, in contrast with bipolar transistors, need substantially no input current, the control electrodes of the corresponding transistors can be connected together directly and without the use of series resistors to restrict the input current. When using field effect transistors, no or substantially no resistors are necessary and it suffices entirely or at least nearly entirely to use transistors so that in general less semiconductor surface area is necessary for the circuit. An additional important advantage of notably insulated gate field effect transistors is that in the case of parallel or series arrangement of the main current paths, electrodes may be used which are common for two transistors. As a result of this, a number of connection conductors and to a considerable extent also space is saved at the surface.

All or at least substantially all the conductor tracks which extend transversely to the supply lines preferably consist of the same conductor material as the gate electrodes of the field effect transistors. Said conductor material may advantageously consist of polycrystalline material in which, by using self-registered gate electrodes, a reduction of parasitic capacitance as well as some space saving can be obtained. Materials such as molybdenum and tungsten may also be used for self-registered gate electrodes.

In an important embodiment of the integrated circuit, the semiconductor surface regions in which the semiconductor zones of the transistors are present are surrounded at the surface by an insulating layer which is inset in the body at least over a part of its thickness. Such an inset insulating layer is preferably obtained by local oxidation of the semiconductor body while using a mask which masks against oxidation and which may consist, for example, of silicon nitride. The use of an inset insulating layer also results in reduction of parasitic capacitance and a further reduction of the required semiconductor surface area.

If an electric separation is necessary between two adjacent transistors of a row, same may be obtained by means of an insulated electrode which is connected to a supply line or another point of suitable potential and which covers the space between the adjacent semiconductor zones of the relevant transistors entirely or partly. However, an inset insulating layer preferably extends between these two adjacent zones.

Usually, if an electric separation is necessary between two transistors in the first row, such a separation will also be desired substantially in the corresponding place in the second row. The inset insulating layer may then advantageously continue in a direction transverse to the supply lines from one side to the oppositely located side of the cell. A connection conductor which forms a connection or at least forms part of a connection between different cells may then be provided on such a strip of insulating material. Such a connection conductor crosses the relevant cell without being electrically connected to it. Said connection conductor, at least in so far as it is present within the cell to be crossed, may be provided simultaneously with the gate electrodes and/or signal lines of the cell. In this manner, connections between non-adjacent rows of cells can be obtained substantially without this requiring extra space, for example, space between adjacent cells of the row of cells to be crossed.

The circuit is preferably constructed with two layers which are separated by an insulating layer and in which conductor patterns are provided, the conductor tracks in the first layer which is present nearest the semiconductor surface extending at least mainly in a direction transverse to the rows of transistors, the conductor tracks in the second layer extending at least mainly in a direction parallel to the rows of transistors, conductor tracks which constitute the supply lines being present in said second layer.

Figure 1C:
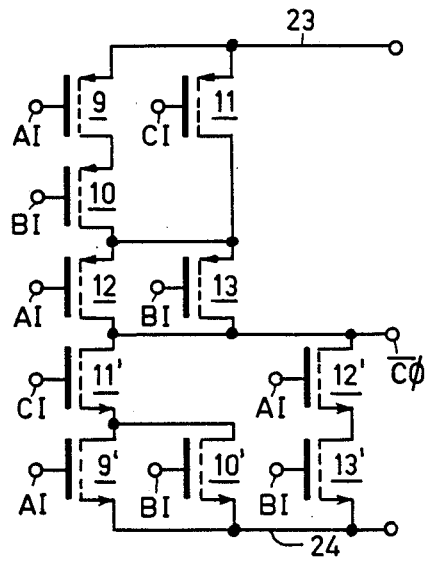
Figure 1D:
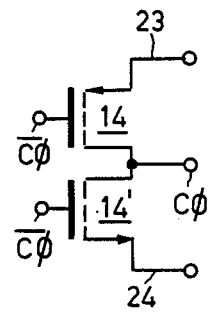
Figure 2:
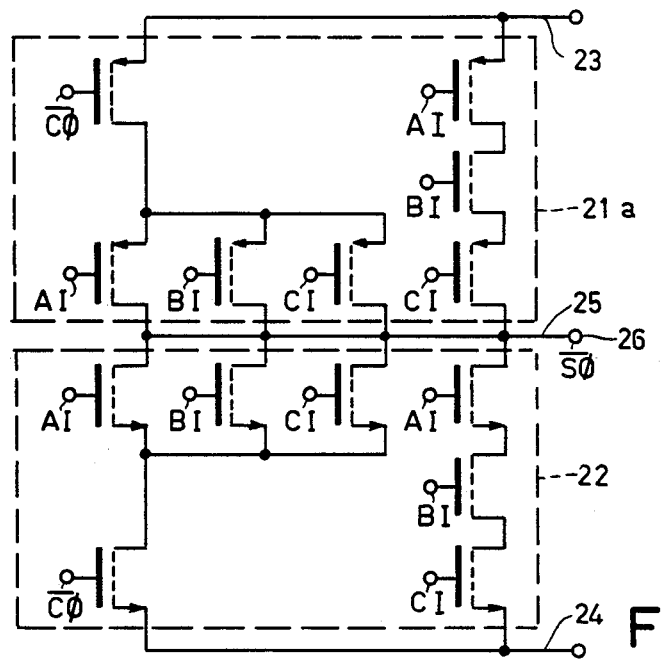
Figure 9:
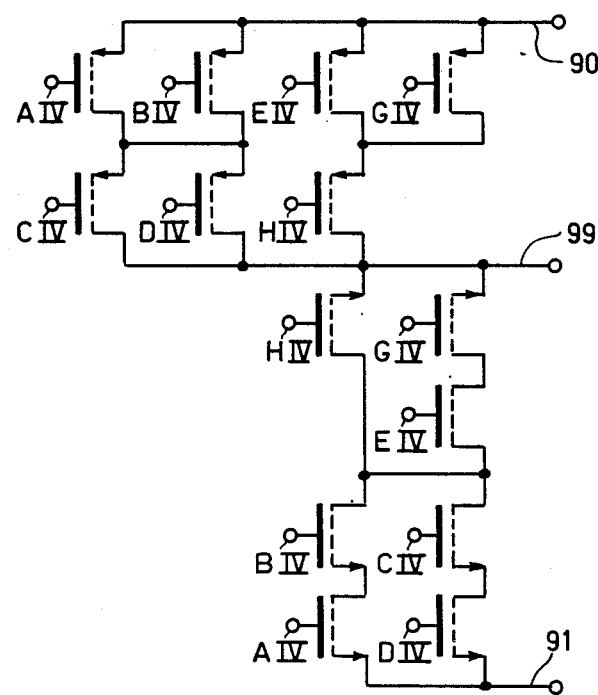
Figure 3:
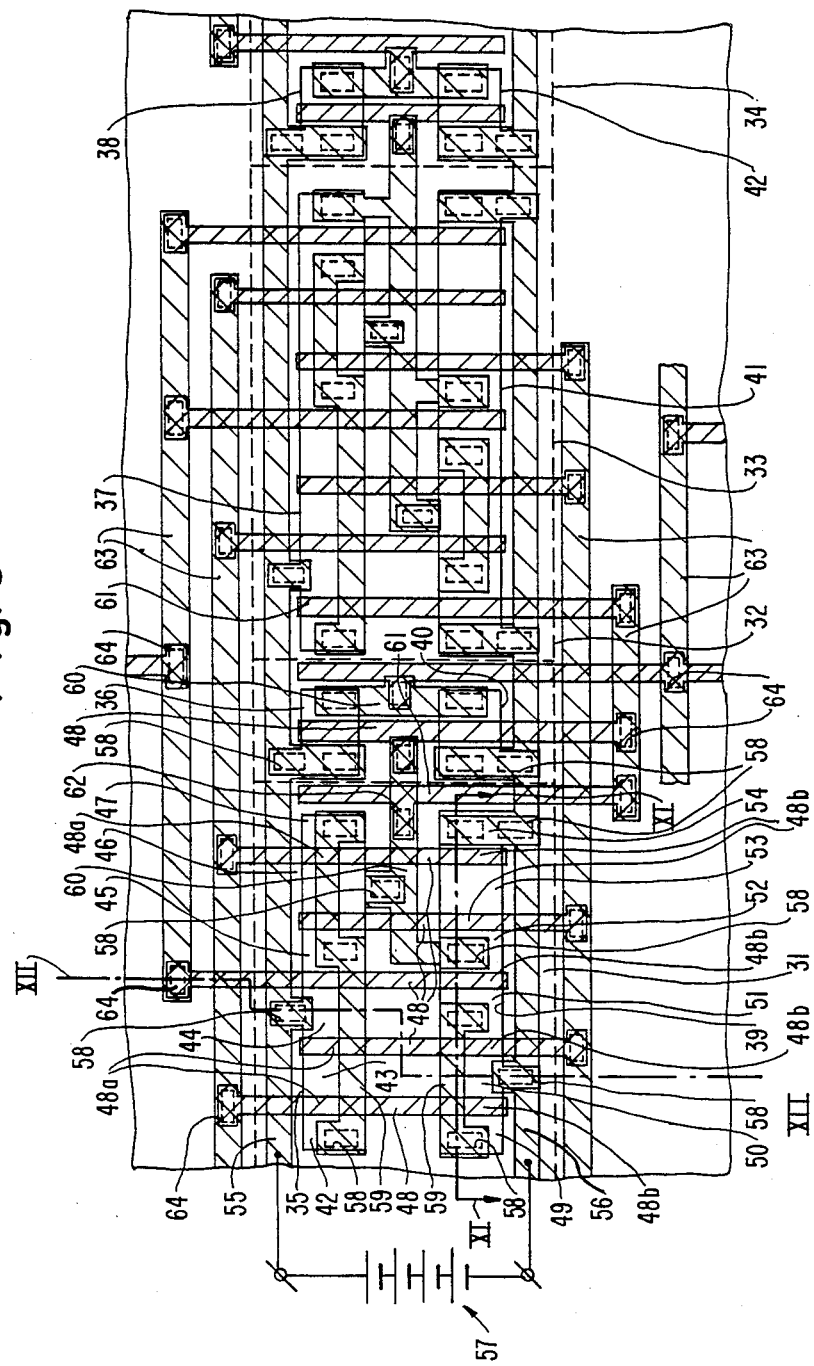
Figure 4:
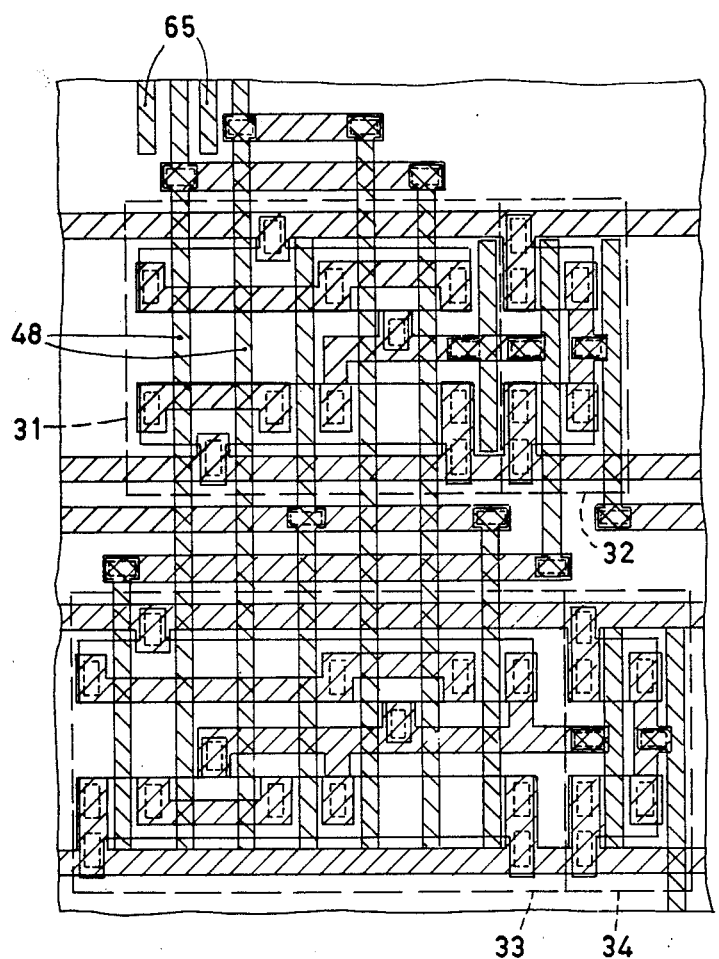
Figure 5:
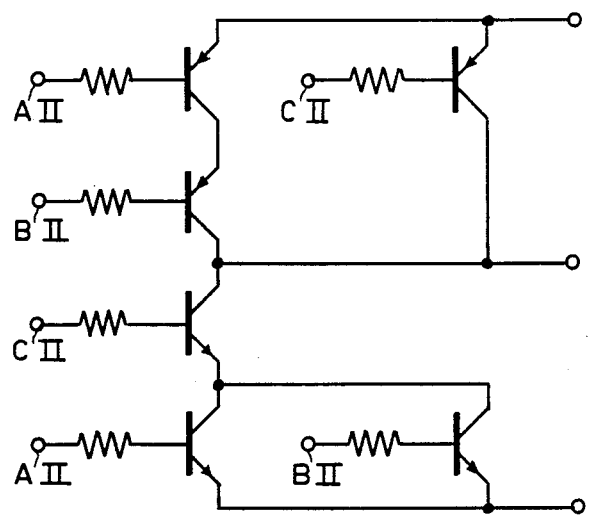
Figure 6:
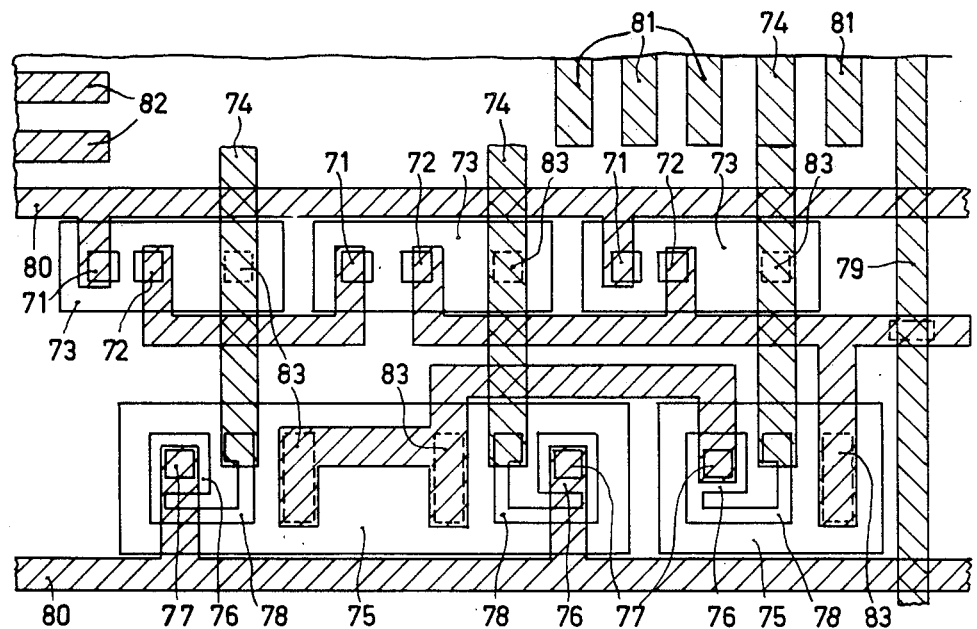
Figure 7:
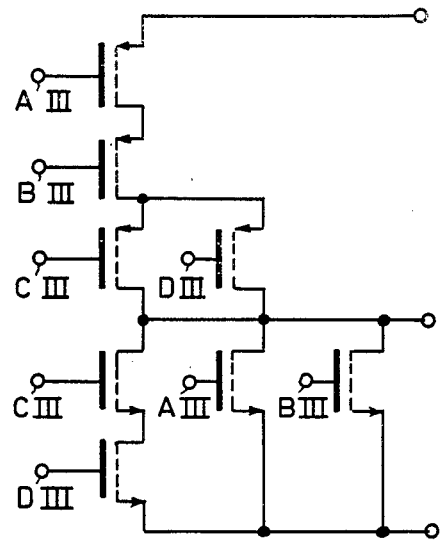
Figure 8:
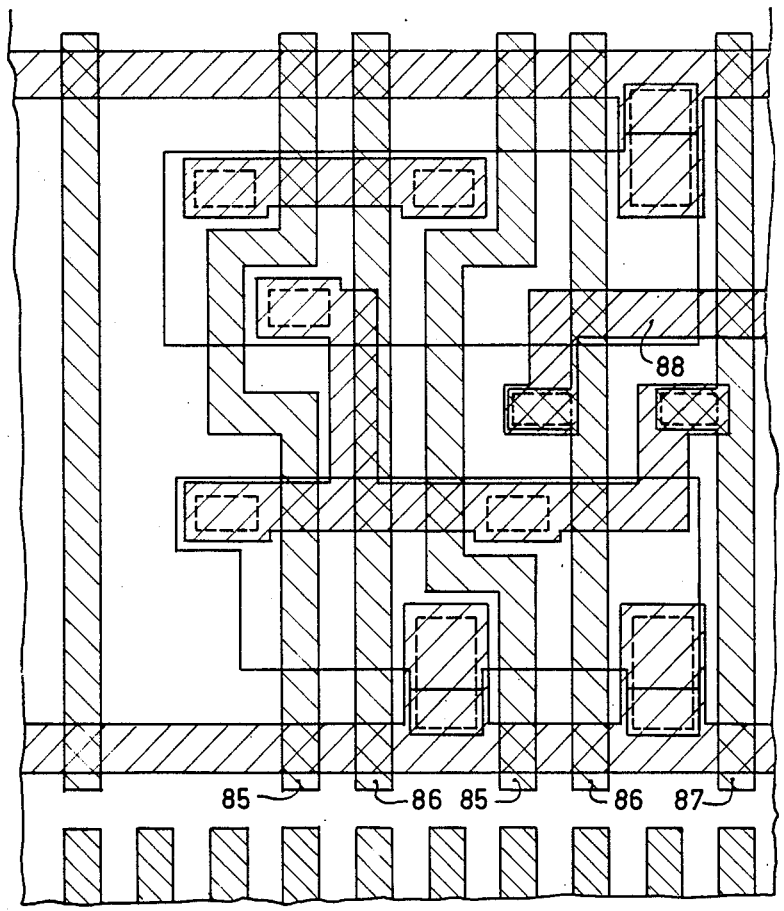
Figure 10:
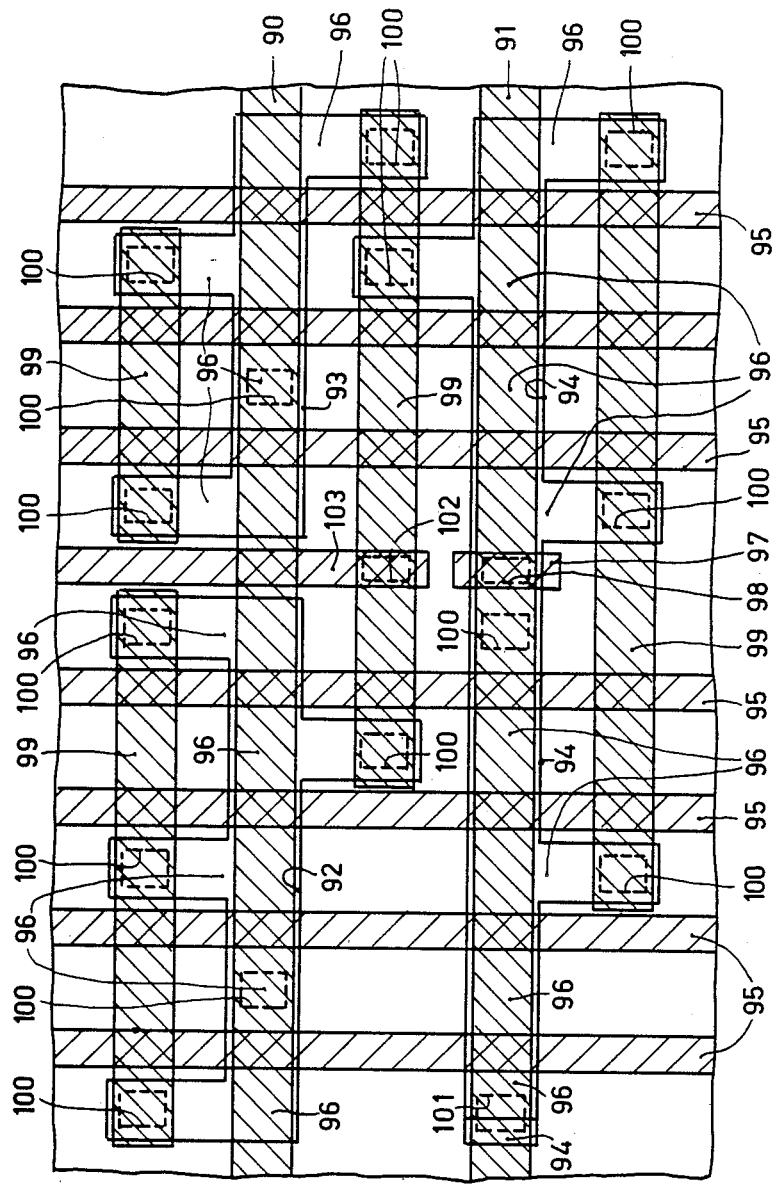
Figure 11:
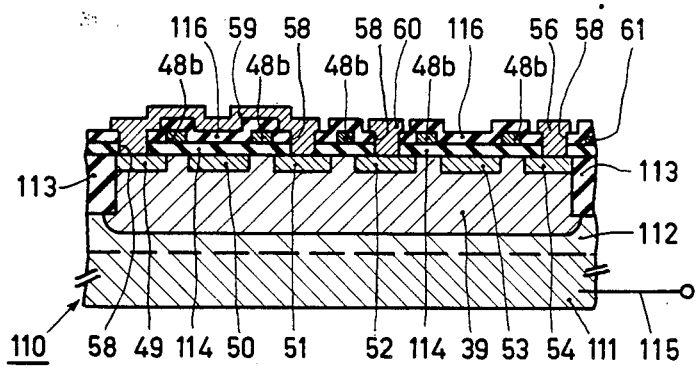
Figure 12:
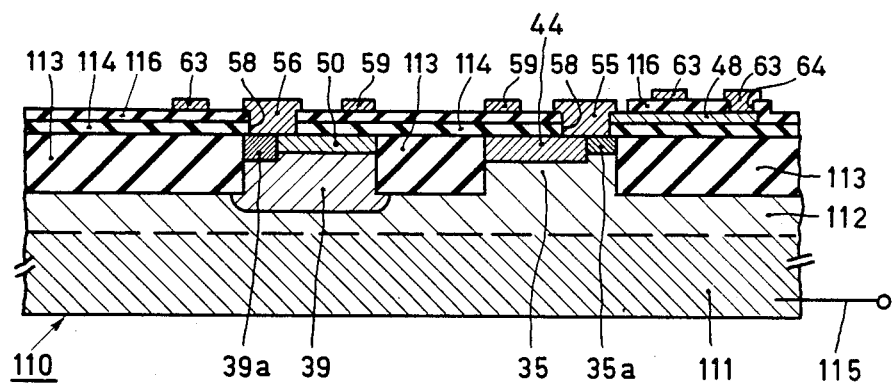

The invention will now be described in greater detail with reference to a few embodiments and the accompanying drawing, in which FIGS. 1A to 1D show a few circuit diagrams belonging to an integrated binary full adder according to the invention, FIG. 2 shows an alternative for the circuit diagram shown in FIG. 1A, FIG. 3 shows diagrammatically a lay-out or topology of an integrated binary full adder according to the invention in which the circuit diagrams shown in FIGS. 1A to 1D are used, FIG. 4 shows diagrammatically a second lay-out or topology for said binary full adder, FIG. 5 shows the circuit diagram of a further embodiment of the integrated circuit according to the invention which belongs to the lay-out or topology shown diagrammatically in FIG. 6, FIG. 7 shows the circuit diagram of still another embodiment of the integrated circuit according to the invention which diagram belongs to the lay-out or topology shown diagrammatically in FIG. 8, FIG. 9 shows the circuit diagram and FIG. 10 shows diagrammatically the lay-out or topology of another embodiment of the integrated circuit according to the invention, FIG. 11 is a diagrammatic cross-sectional view of the integrated circuit shown in FIG. 3 taken on the line XI—XI, and FIG. 12 is a diagrammatic cross-sectional view of said integrated circuit taken on the line XII—XII of FIG. 3, and FIGS. 13a to 13k show a number of standard elements which may serve as components to construct topologies as shown in FIGS. 3 and 4.

The invention is particulary suitable for use in the design and manufacture of complex logic circuits. For clearness' sake, however, the invention will be described in greater detail with reference to comparatively simple examples, such as the binary full adder to be described hereinafter, it being possible for said examples to be used in practice as a component in a more complex circuit.

A binary full adder which adds 2 bits represented by the input signals AI and BI and an incoming carry CI, can simply be described with the following logic equations starting from the truth table:

$$S\phi = AI \cdot \overline{BI} \cdot \overline{CI} + \overline{AI} \cdot BI \cdot \overline{CI} + \overline{AI} \cdot \overline{BI} \cdot CI + AI \cdot BI \cdot CI$$

$$C\phi = AI \cdot BI \cdot \overline{CI} + AI \cdot \overline{BI} \cdot CI + \overline{AI} \cdot BI \cdot CI + AI \cdot BI \cdot CI$$

in which $S\phi$ is the output signal which represents the sum and $C\phi$ is the associated outgoing carry.

Taking into account the fact that the base circuit in complementary transistor logics is a NOT-AND or a NOT-OR gate, a function in the form of a complement will generally be generated by a cell, so as an example $$\overline{SO} = AI \cdot \overline{BI} \cdot \overline{CI} + \overline{AI} \cdot BI \cdot \overline{CI} + \overline{AI} \cdot \overline{BI} \cdot CI + AI \cdot BI \cdot CI$$

Furthermore, the equations can be brought in a more or less optimized form by means of the Boolean algebra. It is preferably endeavoured to restrict the number of required input signals.

When once the form of the equations has been fixed, the required cells can simply be found, each equation corresponding to a cell.

In the present example, the equations may be reduced to, for example:

$$\overline{SO} = \overline{CO} \cdot (AI + BI + CI) + (AI \cdot BI \cdot CI)$$

$$SO - \overline{SO}$$

$$\overline{CO} = \overline{(AI+BI) \cdot CI + AI \cdot BI}$$

$$C\phi = C\phi$$

it being assumed that the input signals AI, BI and CI are available in this form and not in their inverse form. Otherwise it holds good of course that the input signals can be inverted by means of an inverter circuit, if desired, for example, when as a result of this a simpler system becomes possible. When the input signals are available in an inverse form, the equations:

$$S\phi = \overline{C\phi \cdot (\overline{AI} + \overline{BI} + \overline{CI}) + \overline{AI} \cdot \overline{BI} \cdot \overline{CI}}$$

$$C\phi = \overline{(\overline{AI} + \overline{BI}) \cdot \overline{CI} + \overline{AI} \cdot \overline{BI}}$$

may, for example, be used in this case.

In the practical embodiment, the resulting logic equations can generally be converted directly into a topology or lay-out of a cell which generates the required function. For clarity, however, first an associated circuit diagram will be given. The following general rules apply:

1. A cell comprises a logic circuit having two parts arranged in series between two supply lines, in which the cross-over between said two parts forms the electric signal output and in which the transistors of one part are all of the same one (npn or pnp) type and the transistors of the other part are all of the same complementary (pnp or npn) type. The type indications npn and pnp comprise in this connection both bipolar transistors and field effect transistors, so that, for example, transistors of the npn-type may be both bipolar npn transistors and field effect transistors having an n-type channel. For briefness' sake, the part of the circuit which comprises npn-transistors will hereinafter be referred to as the "n-type part" and the part which comprises the pnp transistors will be referred to as the "p-type part".

2. For each transistor in the one part a corresponding complementary transistor is present in the other part, the control electrodes of corresponding transistors receiving the same input signal, usually and preferably because they are connected together.

3. The two parts of the cell each individually generate the same logic function. As a result of this it is achieved that in any combination of input signals the voltage at the output is determined and preferably is substantially equal to the voltage of one or to that of the other supply line, substantially no direct current flowing from one to the other supply line in the stationary condition. If one part constitutes a conductive connection between one supply line and the signal output, all the current paths in the other part between the other supply line and the signal output comprise at least one non-conductive transistor so that said current paths are substantially interrupted. That the two parts generate the same logic function involves, for example, that at will one of the two parts of the cell can be replaced by a resistor without the generated function changing thereby.

This condition is satisfied if for each chain of series-arranged transistors (series circuit) in one part a parallel arrangement of the corresponding transistors (corresponding parallel circuit) is present in the other part and conversely, while parallel arranged circuits in one part correspond to series-arranged corresponding circuits in the other part and conversely and in addition each series arrangement of a composite circuit consisting of a number of parallel arranged circuits and a composite or non-composite second circuit in the one part corresponds to a parallel arrangement of the corresponding composite circuit and the corresponding second circuit.

The above-described duality in the circuit diagram may be demonstrated, for example, with reference to FIG. 1A. This circuit consists of two parts which are denoted diagrammatically by the blocks 21 and 22 which are shown in broken lines and which are arranged in series between two supply lines 23 and 24, the node between the parts 21 and 22 which is formed by the line 25 being the electrical signal output. So the output signal becomes available at terminal 26. The block 21 comprises the p-channel MOS-transistors 1 to 7 and the block 22 comprises the corresponding n-channel MOS-transistors 1' to 7'. The series arrangement of the transistors 2, 3 and 4 between the points N and O corresponds to the parallel arrangement of the transistors 2', 3' and 4' between the lines MPR and TWX. The parallel arrangement of the transistors 5, 6 and 7 between the lines LOQ and MPR corresponds to the series arrangement of the transistors 5', 6' and 7' between the points S and Z. The parallel arrangement of the circuits K-L and N-O corresponds to the series arrangement of the corresponding circuits T-Y and MPR-TWX. The series arrangement of the composite circuit KN-LOQ and the parallel circuit LOQ-MPR corresponds to the parallel arrangement of the corresponding circuit MPR-TWX-Y and the series S-Z.

The described duality may also be described as a correlation between the two parts of the circuit in such manner that each series arrangement of two or more transistors in the one part is consistent with parallelism of the corresponding transistors in the other part and parallelism of transistors in the one part is consistent with a series arrangement of the corresponding transistors in the other part, on the understanding that a group of two or more transistors belonging to the same part of the circuit show parallelism only then, when the transistors of the group are all incorporated in a different current path present between a supply line and the signal output in said part and in addition none of the said transistors occurs in the same series arrangement with another transistor of the group.

Starting from positive logic, the four functions which are necessary for the full adder and which are defined by the above-mentioned combination of four equations can be generated with the circuits shown in FIGS. 1A to 1D when the supply lines 23 are connected to the most positive and the supply lines 24 are connected to the most negative terminal of a supply voltage source and the input signals shown in said figures are supplied to the gate electrodes of the field-effect transistors. The same input signal is supplied to corresponding transistors while in addition in the p-type part the signals which correspond to variables which occur in the equation in OR-relationship are supplied to series-arranged transistors and the signals which correspond to variables which occur in the equation in AND-relationship are supplied to parallel arranged transistors. Generally, a series-arrangement in the p-type part or a parallel-arrangement in the n-type part in positive logic may be considered as a reproduction of an OR-relationship or a so-called union in the equation for function F, and a parallel arrangement in the p-type part or a series-arrangement in the n-type part may be considered as a reproduction of an AND-relationship or a so-called intersection in the equation, the circuit forming the complement of the combination of unions and intersections thus reproduced. It will be obvious that in the case of negative logic the relationship between circuit and equation varies in that sense that instead of series arrangement parallel arrangement must be read, and conversely, series arrangement must be read instead of parallel arrangement.

In the present example, starting from an equation in a fixed form, both the circuit diagram for the p-part and that for the n-part are derived herefrom. As a result of this, the described duality in the diagram of the cell occurs. Since, however, an equation can usually be written in different forms and, for example, for the p-type part start may be made from a different form than for the n-type part, both parts nevertheless generating the same logic function, the said duality is no necessary condition for designing circuits in complementary transistor logic. In practice, the number of possibilities to arrive at a simpler cell by deviation from the duality is restricted in that the input signals, at least for the greater part, will be available only in a given form and not in their inverse form or complement. It is inter alia for this reason, but especially also for simplification of the design system, that it is of advantage to use the same input signals in the p-type part and in the n-type part, so that the gate electrodes of corresponding transistors can be interconnected. However, in this case also, it remains possible, although only in a restricted number of cases, to deviate from the described duality of the circuit. For example, on the basis of the general logic relationship:

$$Y_i \cdot \sum_{i=1}^{n} X_i + \prod_{i=1}^{n} X_i = \left( Y_1 + \prod_{i=1}^{n} X_i \right) \cdot \sum_{i=1}^{n} X_i$$

in the particular case of the full adder the equation for $\overline{S\phi}$ may also be written as:

$$\overline{S\phi} = \overline{(\overline{C\phi} + AI \cdot BI \cdot CI) \cdot (AI + BI + CI)}$$

Starting from this equation, the p-type part of the circuit shown in FIG. 1A may be replaced by a p-type part as shown in the block $21^a$ in the circuit shown in FIG. 2. In this circuit, the same block 22 of FIG. 1A is used for the n-type part. The circuit arrangements shown in FIGS. 1A and 2 are thus equivalent in so far that they generate the same logic function by means of the same input signals and the same number of transistors. The prominent difference between the two circuits is that in the circuit shown in FIG. 1B the largest number of transistors occurring in a current path between a supply line and the electric output is four, while said number in the circuit arrangement shown in FIG. 2 is only three. This difference may be of importance because the maximum number of transistors occurring in a current path between a supply line and the output is restricted in practice by considerations of speed and capacitive load during the commutation of the output from one logic condition to the other. In this case inter alia the electrical properties of the transistors used which depend, for example, upon dimensions and doping concentration, and the value of the supply voltage used play a part. Said maximum number is preferably at least equal to three. For a large number of practical applications a maximum of four or five may be permitted without objection in the present state of technology. In larger systems also, in which often only a restricted part of cells have a decisive influence on the speed of the assembly for these cells, a maximum number of, for example, three or four may be used, while for the remaining cells, for example, a larger maximum of, for example, six or seven may be used.

Reverting to the equivalent circuits shown in FIGS. 1A and 2 it is to be noted that for designing the parts of a cell the use of the possibility to start from different algebraic forms of the same function is preferably avoided. The design system is advantageously maintained as simple as possible, in which stringent rules are used and all the circuits or substantially all the circuits show the above-described duality. This reduces the possibility of mistakes in the ultimate design and reduces the design time.

It is obvious that the abovementioned admissible maximum number of transistors has results for the way in which the system to be designed is described in equations. For example, this maximum for equations written in the form of a sum of minterms or a product of maxterms has for its result that both the number of terms per equation and the number of variables per term may at most be equal to said maximum. When this condition is not satisfied, the function defined by the relevant equation can for practical reasons not be generated by a cell on the basis of said equation and the equation must be reduced to another form or be divided into two or more parts.

Generally, the system to be designed is described with logic equations each forming a hierarchy of logic combinations of variables and it is realised by means of circuits or cells which each constitute a hierarchy corresponding thereto of logic combinations of input signals, a lower logic combination forming part of a next higher combination and the combinations by way of order forming alternately unions and intersections. For each of the two types of combinations a first balance may be alotted to the highest one(s) in rank of said type, which balance is equal to the variables (signals) combined by said combination, hereinafter termed first variables (first signals). Starting from each of these first balances, a final balance may then be formed by increasing the first balance, in so far as applicable per first variable combined by said combination, by a second balance, reduced by one, of a next lower combination of the same type as the combination to which the first balance relates and added hierarchically to said first variable. The second balance is assumed to be equal to the highest of the balances of variables combined by each of said next lower combination to be alotted to the next lower combinations of the same type added hierarchically to the first variable in question, the last-mentioned balances in turn being formed hierarchically in the same manner as a final balance is derived from a first and the associated second balance.

All final balances thus formed may at most be equal to the maximum number of transistors which is still deemed permissible in a current path between a supply line and the electric output of a cell. So for each equation it should hold that the highest final balance does not exceed a previously determined maximum value. N. P. for example, for the above-mentioned equation:

$$\overline{S\phi} = \overline{\overline{C\phi} \cdot (AI + BI + CI) + (AI \cdot BI \cdot CI)}$$

it holds that the combination which is the highest in rank is of the union type, namely the OR-relation between the two variables $\overline{C\phi}\cdot(AI+BI+CI)$ and AI·BI·CI. So the first balance is two. A next lower combination of the union type is added only to the variable $\overline{C\phi}\cdot(AI+BI+CI)$. This next lower combination combines the three variables AI, BI and CI so that the balance of this combination and in this case hence also the second balance is equal to three. The final balance for the unions thus is $2+(3-1)=4$. Taking into consideration the combinations of the intersecting type, the AND-relation between the variables $\overline{C\phi}$ and $(AI+BI+CI)$ and the AND-relation between the variables AI, BI and CI are of the same rank. The balance, also final balance of the first combination, is 2 and that of the second combination is 3. Both the found final balance of the unions and the highest final balance of the intersections may at most be equal to the number of transistors occurring in a current path between a supply line and the output which is deemed maximally permissible. For positive logic the (highest) final balance of the unions is equal to the number of transistors in the largest current path of the g-type part of the circuit and the (highest) final balance of the intersections is equal to the number of transistors in the longest current path of the n-type part.

The number of totally required transistors for a cell is twice the number of input signals n or, if an inverter circuit possibly required at the output is deemed to be included in the cell, it becomes $(2n+2)$.

When the number of transistors of the same type occurring in a current path between supply line and electric output, which number is deemed maximum permissible, is m, at most $2m^2$ or, when the inverter circuit is included, $(2m^2+2)$ transistors can occur in a cell. In practice $(2n+2)$ $(2m^2+2)$ will hold for substantially all cells. Furthermore, in practice current paths between the supply lines and the electric output will often be present both in the p-type part and in the n-type part having a number of transistors which differ from each other.

FIG. 3 shows a lay-out or topology of a part of an integrated circuit having therein a binary full adder. The blocks 31, 32, 33, 34 denoted in broken lines comprise circuits shown in FIGS. 1C, 1D, 1A and 1B, respectively. The integrated circuit comprises a semiconductor body at a surface of which a number of n-type regions bounded by the lines 35, 36, 37 and 38 and a number of p-type regions bounded by the lines 39, 40, 41 and 42 adjoin. A number of these regions are also shown in the cross-sectional views of FIGS. 11 and 12. In the present example, one n-type region and one p-type region are present in each of the blocks 31 to 34. In each of the n-type regions 36 and 38, one p-channel insulated gate field-effect transistor of the enhancement type is present and a row of juxtaposed p-channel insulated gate field-effect transistors of the enhancement type is present in each of the n-type regions 35 and 37. The corresponding n-channel insulated gate field-effect transistors of the enhancement type which are also juxtaposed in a row are present in the p-type regions 40 and 42, 39 and 41, respectively. The n-type region 35 in the block 31 comprises a number of juxtaposed p-type surface zones 42 to 47 which are isolated from each other by intermediate channel regions in which an insulated gate electrode 48a extends above each of the said channel regions. In the same manner the p-type region 39 comprises a number of juxtaposed n-type surface zones 49 to 54 with intermediately located channel regions which are present below the insulated gate electrodes 48b. The gate electrodes 48a and 48b form part of conductor tracks 48, each gate being conductively connected to a gate electrode 48b. Input signals can be supplied to this cell via the conductor tracks 48. The electric output of the cell 31 is formed by the conductor track 61, the signal inputs 48 and the signal output 61 extending substantially parallel to each other and at substantially the same mutual distances in a direction approximately transverse across the cell. Conductor tracks 55 and 56 extend substantially parallel to the rows of transistors. Said conductor tracks constitute the supply lines, in which the track 55, as is shown diagrammatically in FIG. 3, can be connected to the most positive terminal of a supply voltage source 57 and the track 56 can be connected to the most negative terminal of the source 57. Each of the conductor tracks 48 and 61 intersects the conductor track 55 or the conductor track 56. The conductor tracks are distributed over two levels separated from each other by an insulating layer, the conductor tracks 48 and 61 which for clarity are shaded in the Figure in the same direction extending substantially entirely at the first level present nearest to the semiconductor surface and the remaining conductor tracks which are shaded in the opposite direction in the figure, being present substantially at the second level. The supply track 55 is connected, via apertures or windows 58 shown in broken lines in the insulating layer present on the semiconductor surface, to a few p-type zones including the zone 44, and the supply track 56 is connected, via windows 58, to n-type zones such as the zones 50 and 34. Present furthermore at the same second level are conductor tracks 59 which connect a number of p-type zones together and conductor tracks 60 which connect one or more p-type zones and one or more n-type zones to an electric output, such as the conductor track 61. In the block 31, the p-type zones 42, 45 and 47 are connected together in the p-type part, and the n-type zones 49 and 51 are connected together in the n-type part. Furthermore, the p-type zone 46 and the n-type zone 52 are connected, via the conductor track 60, to the signal output 61 present at the first level. For that purpose, an aperture 62 is provided in the insulating layer present between the conductor tracks of the first and the second level. For the rest, the signal output 61 may also be omitted in this case, so that the conductor track 60 forms the electric signal output of the cell, which output leads directly to the signal input 48 of the block 32. Compare, for example, the connection between the output of block 33 and the input of block 34. In the place of the conductor track 61 shown in block 31, for example, a conductor track may be laid across the cell from one edge to the oppositely located edge, which track is not connected to the cell. Such a conductor track crossing the cell does not require extra space at the surface and may be used, for example, for making connections between cells which are arranged in non-juxtaposed rows.

Comparing the cell 31 with the circuit diagram shown in FIG. 1C it may be seen that p-type zone 44 constitutes a supply electrode which is common to the transistors 9 and 11. The p-type zone 43 is drain electrode of transistor 9 and also source electrode of transistors 10. The drain electrode 42 of transistor 10 is connected to the drain electrode 45 of transistor 11 which also is source electrode of transistor 12 and to the source electrode 47 of transistor 13. The drain electrodes of the transistors 12 and 13 are formed by the zone 46 which is connected to the signal output 60, 61. So the p-channel field-effect transistor are juxtaposed in a row in the sequence 10, 9, 11, 12, 13. The corresponding n-channel field-effect transistors lie in a p-type region 39 in the corresponding sequence of successively 10', 9', 11', 12', 13' in a row beside each other, it being noted that in this special case the sequence 13', 12', 11', 9', 10' may also be chosen for the n-channel field-effect transistors because as a matter of fact the same input signal is supplied to the transistors 10' and 13' and to the transistors 9' and 12'. The first-mentioned sequence in which the gate electrodes of corresponding transistors are connected together is to be preferred, however.

In the integrated circuit shown in FIG. 3, the cells 31, 32 and 33, 34 are placed one behind the other without extra intermediate space. On both sides of the row of cells thus formed, space is available for conductor tracks for electric connection and/or through-connection of the cells. The conductor tracks 48 and 61 at the first level may be continue at will on one or on both sides beyond the boundary of the row of cells. Conductor tracks 63 are present at the second level parallel to the row of cells. The conductor tracks 48, 61 and 63 extend according to lines of an imaginary grid in which cross-overs of conductor tracks and connections between conductor tracks of the first and the second level are situated on grid points of the said grid. At the area of the said connections, apertures 63 are present in the insulating layer which is present between the first and the second level of conductor tracks. An important characteristic features of the new topology or lay-out of the integrated circuit according to the invention is the simplicity of the pattern of conductor tracks in which the conductor tracks present within the cells extend for a considerable part according to lines of the same imaginary grid as the conductor tracks present between the cells, in which there is an additional important advantage that the conductor tracks which constitute input signal lines for the cells are accessible for connection on either side of the row of cells. In the present example notably the input and output signal lines 48 and 61 and the supply lines 55 and 56 fit on the said imaginary grid.

This continuation of the imaginary grid across the cells is shown perhaps more clearly in FIG. 4. This figure shows a second lay-out or topology of a full adder which is built up from the same cells 31, 32 and 33, 34 as the above-described embodiment but in which the cells mutually are arranged differently. This space between cells of one row and that between juxtaposed rows of cells can simply be adapted to place and quantity of the conductor tracks necessary for interconnections. In FIG. 4, for example, two grid lines for connections are available between the cells 31, 32 and 33, 34. In a direction transverse to the rows of cells, the density of occupied grid lines between the rows of cells may be larger than above the cells themselves. In other words, one or more conductor tracks 65 may be provided between the signal input lines 48 in the intermediate space between the rows as is shown diagrammatically in the left-hand top of FIG. 4.

In FIGS. 3 and 4, both the channel length and and the channel width of the p-channel MOS-transistors are substantially equal to those of the n-channel MOS-transistors. Notably the channel width of the MOS-transistors can easily be adapted to specific requirements by giving the source and drain zones different dimensions in a direction parallel to the input signal lines. Usually, the dimensions of the cell in said direction will simultaneously be increased or decreased by one or more grid line distances of the imaginary grid. For example, if desired in connection with the different mobility of electrons and holes, the p-channel transistors may be given a channel width differing from that of the n-channel transistors. It may also be desirable to construct the transistors of cells which are connected to an electric output of the integrated circuit so as to be an electric output of the integrated circuit so as to be larger than those of the remaining cells, for example, in connection with the required output power or in connection with the noise margin desired for the relevant output signal.

FIG. 5 shows a circuit diagram of a cell which generates the function $F=\overline{(AII+BII) \cdot CII}$. In this case, bipolar transistors have been used in which series resistors are provided in the control electrode circuits so as to limit the input base current. In an integrated circuit the topology or lay-out of such a cell may be, for example, as is shown diagrammatically in FIG. 6. In this case also the cell is constructed from two rows of juxtaposed transistors. The p-n-p transistors are so-called lateral transistors having an emitter zone 71 and a collector zone 72 which are juxtaposed in an n-type base region 73. The base regions 73 are insulated from each other and they are each connected to a signal input line which is constituted by a conductor track 74. The contact between the conductor track 74 and the base region 73 of the p-n-p transistors is at an ample distance from the emitter and collector zones 71 and 72 so that in the base the desired extra series resistance for the current restriction is present. In the n-type part the transistors are constructed as vertical transistors. In a number of n-type collector regions 75 which are insulated from each other, one or more transistors are present which furthermore have a p-type base zone 76 and an n-type emitter zone 77. The desired base series resistances are formed by p-type regions 78 which are constructed as extensions of the base zones 76. Contact zones 83 may be present as is usual for contacting the base regions 73 and the collector regions 75.

In the p-n-p transistors, the emitter and collector zones are equal to each other and exchangeable as regards their function. In the p-n-p transistors, the emitter contact and the collector contact are present in a direction parallel to the rows of transistors at equal distance from the base contact, so that the geometry relative to a line transverse to the rows of transistors and through the base contact can be mirrored. These properties may advantageously be used to enable the required pattern of conductors to be made as simple as possible.

In this example also, the input signal lines 74, the output signal line 79 and the two supply lines 80 coincide with grid lines of the imaginary grid which lies at the root of the arrangement of the conductor tracks for electric connections and/or mutual connection of the cells. In this example, space is easily present between each pair of signal input lines 74 outside the cell for three conductor tracks 81 which may be used for making cross-overs. In a direction parallel to the supply lines 80, conductor tracks 82 for connection or interconnection may be present. Dependent upon the method of manufacturing and the chosen transistor geometry, the smallest mutual distance between conductor tracks 82 and that between teh conductor tracks 81 may be equal to each other or be different from each other.

In the present example, the signal input lines 74 extend straight across the cell and the row of collector regions 75 is slightly staggered relative to the row of base regions 73. A more rectangular cell is obtained by shifting the collector regions 75 in a direction parallel to the supply lines 80 and, viewed in the figure to the left, over twice the grid line distance between the conductor tracks 81. The signal input lines may be adapted by using twice an angle of 90 degrees. Such a cornered input conductor track may be present, just as the tracks 74 shown, entirely at one of the two levels of conductor tracks. By using a shift of an integer number of times the grid line distance, the cell remains accessible on either side for the direct connection to conductor tracks extending according to grid lines.

FIG. 7 shows the circuit diagram of a cell for generating the function $\overline{F}=AIII+BIII+CIII\cdot DIII$. A possible topology or lay-out of such a cell is shown in FIG. 8. The cell has two rows of juxtaposed insulated gate field-effect transistors. In this example use has inter alia been made of the fact that not all the semiconductor zones which form the source and drain electrodes are connected to a conductor track. The dimensions of the electrode zones in the direction of the row may be kept small so long as there is sufficient space available for a contact, where necessary. The input signal lines 85 each have an even number of right angles while the input signal lines 86 and the output signal lines 87 are straight. As compared with, for example, the topology shown in FIG. 3, the electrode zones have a smaller area so that the cell is comparatively compact and in addition inter alia the parasitic capacitances between the zones and the substrate are smaller. In addition, this example shows that input signals need not always be supplied to the cells in a direction transverse to the row of cells but that input signal connections such as the conductor track 88 in a direction parallel to the supply lines are also possible.

The following example relates to a cell for generating the function $\overline{F}=\overline{(AIV\cdot BIV+CIV\cdot DIV)\cdot(EIV\cdot GIV+HIV)}$. The circuit diagram shown in FIG. 9 corresponds to the diagrammatic topology or lay-out shown in FIG. 10. In this case also the cell in an integrated form has a row of p-channel field-effect transistors and a row of n-channel field-effect transistors, said rows being arranged parallel to the supply lines 90 and 91. In contrast with the preceding examples, the supply lines do not extend along the edges of the cell but they are present closer together and nearer to the center of the cell. The p-type part has two n-type surface regions 92 and 93 which are isolated from each other at the surface and which each comprise a number of transistors. The n-channel transistors lie in a common p-type region 94. Both in the p-type part and in the n-type part electrode zones 96 are present on either side of each signal input conductor 95 and extend in the semiconductor regions 92, 93 and 94. Two electrode zones 96 are also present in the p-type region 94 on either side of the conductor track 97. Via an aperture 98 in the insulating layer present between the two levels of conductor tracks, said conductor track 97 is permanently connected to the supply track 91. As a result of this the conductor track 97 can be compared with the gate electrode of a field-effect transistor which in the operating condition is permamently in the non-conductive state. The electrode zones 96 present on either side of said conductor track are thus electrically insulated from each other and that in a manner which forms an alternative for that which is used in the p-type part. In order to obtain the desired electric insulation, the transistors in the p-type part are simply divided between two n-type regions 92 and 93 which are isolated from each other at the semiconductor surface.

Conductor tracks 99 which connect field-effect transistors of the cell together, extend parallel to the supply tracks. The conductor tracks 90, 91 and 99 are connected to electrode zones 96 via apertures 100 in an insulating layer. In the aperture 101 the supply track 91 contacts both an electrode zone 96 and a surface part of the p-type region 94. In the present case it is assumed that the p-type surface region 94 is an island-shaped region which is embedded in an n-type semiconductor body. The connection with the supply line 91 is then desired so as to be sure that the electrode zones 96 are reversely biased relative to the surface region 94. In this connection, the electric insulation shown by means of the conductor track 97 is of advantage. In this form of insulation, no division of the p-type region into two isolated parts is necessary and a singal connection with the supply line 91 will suffice. In practice, connections of the surface regions will usually be combined with connections of electrode zones to the supply line, as is denoted in the aperture 101. Electric insulation by means of a conductor track 97 will then be used in particular if not a single one of the electrode zones is directly connected to the supply line on one of the two sides of the insulation.

The conductor tracks 99 are arranged so that in a direction parallel to the supply lines and hence to the row of cells at most five conductor tracks are present beside each other. When insulated gate field-effect transistors are used, the field-effect transistors in a cell are preferably arranged so that said number of maximum five parallel conductor tracks is not exceeded. It has been found that said number of five parallel conductor tracks when using insulated gate field-effect transistors suffices in all cases so as to be able to realize the desired connections, so also for cells which form particularly complex combinations of input signals. This is of importance in particular because cells of the same dimension in a direction transverse to the row of cells are preferably used.

The conductor track 99 present in the centre of the cell may form the output signal line of the cell. In the present example said conductor track is also connected via an aperture 102 to a conductor track 103 which leads between the two separated n-type regions 92 and 93 and parallel to the input signal lines 95 to the edge of the cell.

The examples described clearly demonstrate that also with the arrangements of the transistors in rows characterictic of the present invention a great extent of freedom and flexibility of the topology or lay-out of the cells exists in which numerous variations are possible. In addition to the variations already described exchangeable signal input lines are often present in a cell, for example, in the equivalent transistors 2, 3 and 4 and 2', 3' and 4', respectively, in the example according to FIG. 1A. Groups of transistors may also be changed of position in the row of transistors, for example, the group formed by the transistors 9, 10 and 11 and 9', 10' and 11', with the group formed by the transistors 12 and 13 and 12' and 13', respectively. This exchangeability may be used inter alia to arrive at a network of conductor tracks which is as simple as possible for the connection of the various parts of the integrated circuit. In addition it is of importance that, particularly with cells in which several groups occur with an even number of transistors, the number of required electric isolations between adjacent transistors belonging to different groups may be dependent upon the chosen sequence of the group. Because extra space is necessary for said isolation, it is to be preferred when the sequence is chosen to be so that the juxtaposed transistors of different groups can have a common electrode zone as much as possible. In many cases an electric isolation will be necessary after two groups having an even number of transistors, in which between said two groups one or more groups having an odd number of transistors may or may not be present, without isolations therebetween being necessary.

The use of the invention results in integrated circuits which can comparatively simply be designed with a comparatively compact topology or lay-out, which circuit can be manufactured in a manner conventionally used in semiconductor technology and while using technologies known in said art. All the manufacturing methods with which integrated circuits with complementary transistors can be obtained may be used.

Within the scope of the invention there is a preference for the use of field-effect transistors because generally cells with smaller dimensions can be obtained therewith than with bipolar transistors, while in addition fewer manufacturing steps are necessary for the manufacture. On the basis hereof, notably with LSI- and MSI-circuits, the manufacture can be used with a greater yield when using field-effect transistors.

In order to give an impression of a possible structure of an integrated circuit having insulated gate field-effect transistors, FIGS. 11 and 12 show cross-sectional views of the part of the integrated circuit of which the plan view corresponds to FIG. 3. The cross-sectional views are taken on the lines XI—XI and XII—XII shown in FIG. 3.

The integrated circuit has a semiconductor body 110, in this case an n-type silicon substrate 111, having thereon a lower doped n-type surface layer 112. In the surface layer 112 is provided a pattern which is formed by an insulated layer 113 which is inset in the semiconductor layer 112 at least over a part of its thickness. Such a layer may be obtained, for example, by local oxidation of the semiconductor surface. The inset insulating layer 113 has a number of apertures in which parts of the surface layer 112 extend up to the surface. These parts form n-type surface regions such as the region 35. A number of said n-type surface regions have been coverted into p-type surface regions by doping, such as the surface region 39. The semiconductor body described thus far has the required n-type and p-type surface regions for making complementary field-effect transistors. As is known, bodies with semiconductor surface regions of different conductivity types can be obtained in various other manners and have a different form or structure. The surface regions may be present, for example, as isolated regions on an insulating substrate. The inset insulating layer 113 may be replaced, for example, by grooves which are filled or are not filled, or it may also be omitted entirely. Within the scope of the invention which is applicable notably to large integrated circuits having may circuit elements, the structure shown with an inset insulating layer has the important advantage that a compact topology is obtained in which the field-effect transistors and also the conductor tracks for connection have comparatively small parasitic capacitances.

Field-effect transistors can be provided in several known manners in the n-type and p-type surface regions. In the present example, self-registered gate electrodes have been chosen which, for example, may consist of molybdenum or of polycrystalline silicon. Transistors having comparatively small parasitic capacitances can be obtained with said self-registered gate electrodes, in which the said polycrystalline gate electrodes have the further advantage that the threshold voltage of the transistors is comparatively low and can be varied within certain limits by means of the doping concentration.

The polycrystalline gate electrodes 48b (FIG. 3) are insulated from the semiconductor circuit by an insulating layer 114. They are provided, together with the gate electrodes 48a, the input signal lines 48, the output signal lines 61 (FIG. 3) and the conductor tracks 65 (FIG. 4), so together with all the tracks present at the first level of conductor tracks, namely before the doping for the electrode zones are provided.

In the p-type surface regions, such as the region 39, n-type surface zones, in this case the zones 49 to 54, are provided, for example, by diffusion or ion implantation. Contact zones, such as the zone 35a, can simultaneously be obtained in one or more of the n-type surface regions. By means of said contact zones, the n-type surface regions can be connected to the positive supply line 55. Such a connection to the positive supply voltage may also be obtained via a connection 115 to the substrate 111 which is shown diagrammatically. P-type surface zones, such as the zone 44, may be provided in the n-type surface regions, in which, if desirable, contact zones, such as the zone 39a, can simultaneously be obtained in the p-type surface regions. The p-type surface regions can be connected to the negative supply line 56 via said p-type contact zones.

After providing the surface zones which form the source and drain electrodes of the field-effect transistors, the semiconductor surface may be or become covered completely with an insulating layer, while the conductor tracks 48, 61 and 65 may be oxidized. If desired, a second insulating layer 116 may be provided, for example by deposition from the gaseous phase, also on the insulating layer 114 and across the conductor tracks 48, 61 and 65. For contacting the desired electrode zones, apertures 58 may be provided which extend through the two insulating layers 114 and 116 down to the semiconductor surface. Above conductor tracks which lie at the first level apertures 64 may also be provided in the uppermost insulating layer 116. On the insulating layer and in the apertures 58 and 64, the conductor tracks of the second level 55, 56, 59, 60 and 63 may be provided, the conductor tracks of the second level, where necessary, being insulated from the conductor tracks of the second level by the insulating layer 116.

Figure 13:
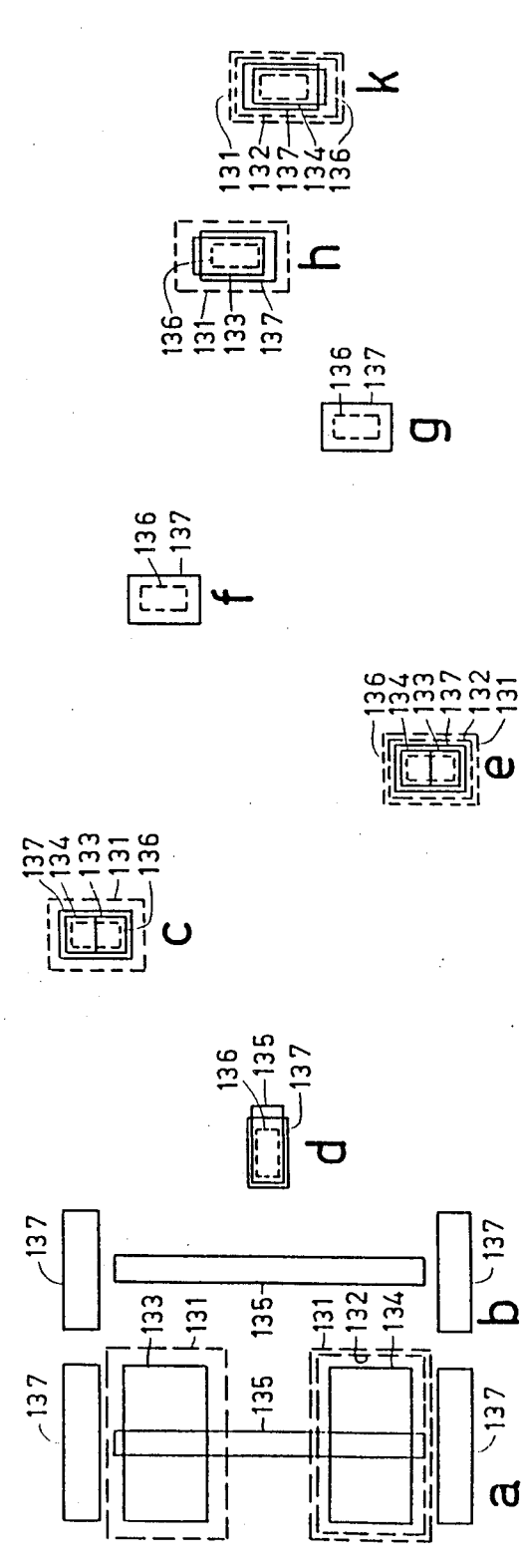

In the above-described embodiment, the cells can be described with a restricted number of standard elements which can easily be adapted to possible changes in the technology, for example, the permitted minimum width of conductor tracks at the first and/or the second level or their minimum mutual distance or the minimum dimensions of apertures in the insulating layers. FIG. 13 shows nine of such standard elements a to h and k, which each comprise, in as far as necessary, boundaries for various masks to be used in the manufacture. By repetition and combination of such standard elements in which several elements can overlap each other, a substantially full description of the topology or lay-out of the cells can be obtained. The elements shown may be used in integrated circuits as is shown in FIGS. 3 and 4. Incorporated in said standard elements are boundaries 131 for an oxidation mask, boundaries 132 for the diffusion mask for the p-type surface regions, boundaries 133 and 134 for the diffusion mask for the p-type and for the n-type electrode zones, respectively, boundaries 135 for the etching mask for the conductor tracks at the first level, boundaries 136 for the etching mask for the contact apertures and boundaries 137 for the etching mask for the conductor tracks at the second level.

Such a simple set of standard elements completed by a few standard data regarding the conductor tracks at the second level can replace the abovementioned library of standard cells of the system "micromosaic". If desired, said library of standard elements and standard data may be completed, temporarily or not temporarily, by frequently required cells and/or more complex units such as flip-flops and permanent or non-permanent memories (read only and, for example, random access memories).

Said more complex units may have a deviating electric build up and topology or lay-out, for example, when the described duality and arrangement in rows of the transistors would result in comparatively large required areas, or because the units are characterized in themselves already by a large internal regularity. By maintaining the string of cells and their arrangement in rows, the advantages of the internal regularity present can sometimes not be used sufficiently. This latter may occur, for example, in memories. Actually, these often consist of a matric of identical memory elements in which usually an arrangement of the memory elements in the form of a matric can also be used advantageously in the topology or lay-out.

In general, at least the cells which are necessary for the combinatory part of the logic circuit will be composed all or substantially all on the basis of the logic equations for the integrated circuit in question to be designed and said cells will hence form no part, and at least not permanently of the said library. The direct reproduction of the equations in the lay-out in which terms in the equation appear as a series or parallel chain in the lay-out presents many advantages. For example, it can immediately be read in the equation how many transistors and electric separations are necessary between transistor circuits, as a result of which the length of the cell in the direction of the row is substantially also known directly.

It will be obvious that the invention is not restricted to the embodiments described but that many variations are possible to those skilled in the art without departing from the scope of this invention. For example, other semiconductor materials or other insulating layers, such as silicon nitride or aluminium oxide or combinations of layers of differently insulating material may be used. Conductive layers of other materials, for example, tungsten, titanium-gold or titanium-platinum-gold may also be used. Integrated circuits with a lay-out designed in the described manner may also be realised with manufacturing methods other than those described. For example, the surface regions in which the transistors are provided, may be, for example, regions which are separated from each other and which are provided on an insulating substrate, Ion implantation, for example, may also be used to obtain surface regions and/or electrode zones with a suitable doping concentration.

The conductor tracks which extend parallel to the signal input tracks and the supply lines, respectively, preferably consist of the same material as said signal input tracks, respectively. In some places in the lay-out, this general rule may advantageously be deviated from, namely, for example, if between two signal input lines of a cell a connection is necessary and said connection is not crossed by other signal input lines or the signal output line. Said connection may then be realised at the same first level as and simultaneously with the signal lines. In this manner, junctions from the first to the second level, and conversely, are saved.

What is claimed is:

1. An integrated circuit layout having a common body with a plurality of cells, each cell including a plurality of complimentary transistors, said cells being adjacent each other in a prescribed row on said common body, each cell including a first semiconductor region having a plurality of transistors of one type disposed in a first row aligned with said prescribed row, each cell also including a second semiconductor region having a plurality of transistors of a type complementary to the one type of said associated cell, said complementary types in each cell being disposed in a second row parallel with said first row of said associated cell, each said second row of transistors having the same number of transistors as said first row in its associated cell, said first and second semiconductor regions in adjacent cells being aligned, respectively, each said transistor having a control electrode and conducting electrodes having a primary current path therebetween, said circuit layout also including two power supply lines in substantially parallel paths, said rows of transistors in each cell being disposed substantially parallel to said power supply lines and being conductively connected thereto, said circuit layout also including signal lines, at least portions of said signal lines being disposed substantially perpendicular to said rows of transistors, said signal lines crossing said power supply lines and being insulated therefrom, said signal lines forming at least in part interconnections for the control electrodes of said rows of transistors, and conductor tracks interconnecting the transistors of each of said rows in circuits in which certain of the transistors of each row have their primary current paths connected in parallel circuit paths and certain of the transistors of each row have their primary current paths connected in series circuit paths, at least portions of said conductor tracks being disposed substantially parallel to said supply lines, said plurality of cells including at least two cells whose logic circuitry is different from each other, a further conductive track crossing at least one of said two power supply lines while being insulated therefrom, and an additional connection line located between said two power supply lines and being conductively connected to said rows of transistors, said further conductive track contacting said additional connection line and being disposed substantially perpendicular to said two power supply lines and said additional connection line.

2. An integrated circuit layout according to claim 1, wherein said conductor paths interconnecting the transistors of each row also include paths disposed substantially perpendicular to said supply lines.

3. An integrated circuit layout according to claim 1, wherein the whole length of each of said signal lines is disposed substantially perpendicular to said supply lines.

4. An integrated circuit layout according to claim 2, wherein said signal lines comprise the control electrodes of said transistors.

5. An integrated circuit layout according to claim 4, wherein said supply lines are connected to said transistors by conductors disposed substantially perpendicular to said supply lines.

6. An integrated circuit layout according to claim 5, wherein said first and second regions on said body are located between supply lines.

7. An integrated circuit layout according to claim 1, wherein said signal lines include portions which are disposed both substantially perpendicular to and substantially parallel to said supply lines.

8. An integrated circuit layout according to claim 1, wherein said conductor paths are disposed on said integrated circuit above said transistor rows.

9. An integrated circuit layout according to claim 8, wherein said signal lines are all disposed substantially perpendicular to said supply lines and wherein said integrated circuit layout includes conductors disposed substantially parallel to said supply lines to connect said control electrodes to said signal lines.

10. An integrated circuit layout as claimed in claim 1, wherein said signal lines are in a first conductive layer and wherein an insulating layer is formed between said first conductive layer and the surfaces of said semiconductor regions and said power supply lines are present in a second conductive layer in contact with the surfaces of said semiconductor regions.

11. An integrated circuit layout as claimed in claim 1, wherein the complementary transistors are field effect transistors.

12. An integrated circuit layout as claimed in claim 11, wherein the field effect transistors are of the insulated gate electrode type, in which the signal lines and the conductor paths are the same material as the gate electrodes.

13. An integrated circuit layout as in claim 1, wherein at least some of said signal lines cross said power supply lines.

14. An integrated circuit of complementary bipolar transistors each having a control electrode and conducting electrodes providing a primary current path therebetween, said circuit comprising a body having two power supply lines disposed on a substantially parallel path,
  a first semiconductor region on said body including at least three transistors of one type disposed in a first row adjacent each other,
  a second semiconductor region on said body including at least three transistors of the complementary type adjacent each other in a second row parallel to said first row,
  said second row of transistors having the same number of transistors at said first row, said rows of transistors being disposed substantially parallel to said power supply lines and being conductively connected thereto,
  signal lines on said body, at least portions of said signal lines being disposed substantially perpendicular to said rows of transistors, said signal lines forming at least in part the connections for the control electrodes of said rows of transistors, and
  conductor paths interconnecting the transistors of each of said rows in circuit in which certain of the transistors of each row have their primary current paths connected in parallel and certain of the transistors of each row have their primary current paths connected in series,
  at least portions of said conductor paths being disposed substantially parallel to said supply line,
  said conductor paths interconnecting the transistors of each row also including paths disposed substantially perpendicular to said supply lines.

15. An integrated circuit as claimed in claim 14, wherein the whole length of each of said signal lines is disposed substantially perpendicular to said supply lines.

16. An integrated circuit according to claim 15, wherein said first and second regions on said body are located between said supply lines.

17. An integrated circuit according to claim 16, wherein said conductor paths are disposed on said integrated circuit above said transistor rows.

18. An integrated circuit according to claim 14, wherein at least some of said signal lines cross said power supply lines.

* * * * *